United States Patent [19]

Chopra et al.

[11] Patent Number: 4,714,625

[45] Date of Patent: Dec. 22, 1987

[54] DEPOSITION OF FILMS OF CUBIC BORON NITRIDE AND NITRIDES OF OTHER GROUP III ELEMENTS

[76] Inventors: Kasturi L. Chopra, 16 West Ave., IIT, Hauz-Khas, New Delhi, India; Roitan F. Bunshah, 8138 Zitola Ter., Playa Del Rey, Calif. 90293; Chandra V. Deshpandey, 3426 Jasmine Ave., Los Angeles, Calif. 90036; Vasant D. Vankar, Dept. of Physics,IIT, Hauz-Khas, New Delhi, India

[21] Appl. No.: 764,345

[22] Filed: Aug. 12, 1985

[51] Int. Cl.⁴ .............................................. B05D 3/06
[52] U.S. Cl. ........................................ 427/35; 427/38; 427/42; 427/47; 427/255; 427/255.2; 427/255.3; 427/314
[58] Field of Search ....................... 427/38, 42, 35, 47, 427/255, 255.2, 255.3, 314

Primary Examiner—Bernard D. Pianalto
Attorney, Agent, or Firm—Walter Unterberg

[57] ABSTRACT

Process for producing cubic boron nitride films on a substrate by activated dissociation reduction-reaction. Boric acid in the condensed state is evaporated in a vacuum chamber from a resistance-heated evaporation source and ammonia gas is introduced into the chamber. The vapor of the boric acid and the molecules of the ammonia gas are ionized by a beam of low-energy electrons in the reaction zone between the resistance-heated evaporation source and the substrate. The ammonia gas reacts with the boric acid in a two-step process in which (1) the boric acid is reduced by the atomic hydrogen formed by the dissociation of ammonia, and (2) the resulting boron atoms react with the nitrogen atoms released by the dissociation of ammonia to form boron nitride which deposits as a film onthe substrate. This film has the cubic boron nitride structure and is ready for use without requiring post-deposition heat treatment.

16 Claims, 1 Drawing Figure

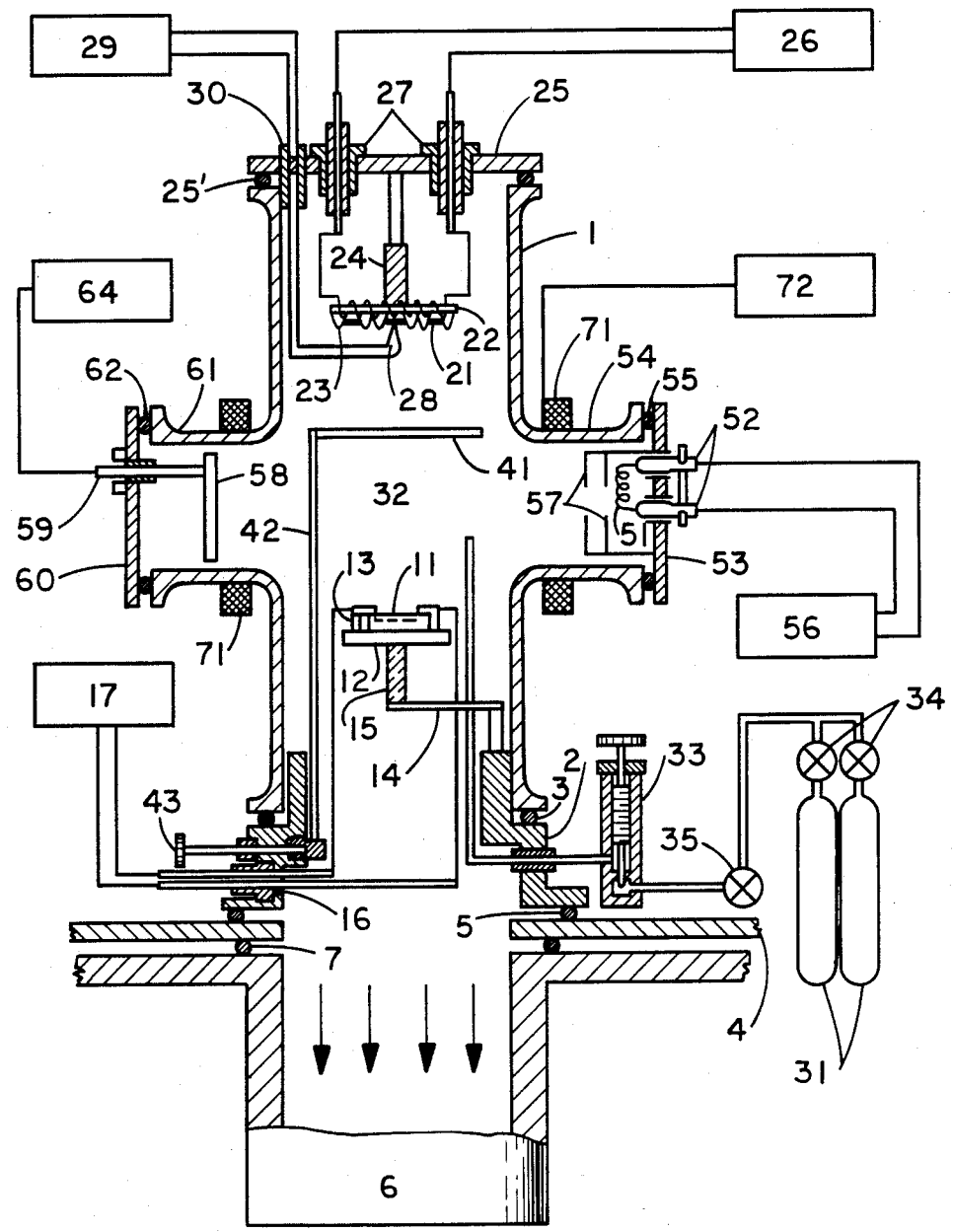

DEPOSITION OF FILMS OF CUBIC BORON NITRIDE AND NITRIDES OF OTHER GROUP III ELEMENTS

BACKGROUND OF THE INVENTION

1. Field of the Invention

This invention relates to a process for the deposition of films of cubic boron nitride and nitrides of other Group III elements in the periodic table of elements. More specifically, it relates to the use of the Activated Dissociation Reduction-Reaction process to produce coatings of cubic boron nitride on substrates for various applications.

2. Prior Art

Boron nitride exists in two allotropic forms—hexagonal and cubic. Cubic boron nitride films are useful in a variety of applications such as passivating and insulating layers for microelectronic applications, antireflection coatings for infrared optics, chemical and moisture resistant coatings, corrosion resistant coatings and hard coatings for cutting tools to produce higher cutting rates than those possible with tungsten carbide tools.

Several methods can be used to produce cubic boron nitride. At room temperature it is usually produced by a high pressure technology which is a complex, low-volume production method which makes the cutting tools so produced rather expensive. Synthesis of cubic boron nitride from boron nitride using certain aluminum alloys as catalysts is taught in U.S. Pat. No. 3,918,219, R. H. Wentrof, Jr., et al. This process is a high-temperature, high-pressure synthesis technique.

Alternate, inexpensive high-production methods for deposition of cubic boron nitride films involve vapor deposition techniques. A high-rate physical vapor deposition process called the Activated Reactive Evaporation process was invented by R. F. Bunshah, U.S. Pat. No. 3,791,852 for use with an electron-beam-heated evaporation source, and later by Bunshah and Nath, U.S. Pat. No. 4,336,277 for use with a resistance-heated source. Bunshah and Raghuram (Journal of Vacuum Science and Technology, Vol. 9, pp. 1385, 1972) deposited films of nitrides, carbides and oxides by the Activated Reactive Evaporation process using an electron beam-heated source. Bunshah and Nath deposited films of indium tin oxide using the resistance-heated evaporation source in the same process.

The resistance-heated evaporation source is preferred over the electron beam-heated source for low melting, high vapor pressure (i.e., easily evaporable) materials such as Indium, Tin, Zinc, etc. whereas the electron beam-heated source is preferred for evaporating high melting point metals such as titanium, zirconium, hafnium, niobium, etc.

Both versions of the Activated Reactive Evaporation process involve the same basic principle. Metal vapors are produced from a metal billet by heating the billet. A reactive gas at a low partial pressure (typically $2 \times 10^{-4}$ to $1 \times 10^{-3}$ torr) is introduced into the chamber. The metal vapor atoms and gas molecules are ionized by low energy electrons, thus "activating" the reaction between them, resulting in the formation and deposition of a compound film of nitrides, oxides or carbides on the substrate. Low-energy electrons (10 to 200 eV) are essential since their ionization cross-section is much higher than high energy electrons (above 500 eV). The only difference between the two versions of the activated reactive evaporation process is the source of the low-energy electrons to ionize the metal atoms and gas molecules. With the electron-beam evaporation source (U.S. Pat. No. 3,791,952) the low-energy electrons are extracted from the plasma sheath on top of the molten pool by means of a positively biased probe located some distance above the evaporation source and attracted into the space above the evaporation source and below the substrate to cause the ionization to occur. For the version using the resistance-heated source (U.S. Pat. No. 4,336,277), low-energy electrons emitted by an auxiliary thermionically heated tungsten filament traverse the path of the metal atoms and gas molecules to produce ionization. Figures illustrating both the apparatuses are given in the two patents referred to and are incorporated here by reference. Both processes are carried out in a vacuum chamber with appropriate equipment (pumps, valves, substarte heaters, etc.) as described in the patents cited above and are also incorporated here by reference. Typical examples of such reactions are:

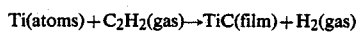

Ti(atoms)+C$_2$H$_2$(gas)→TiC(film)+H$_2$(gas)

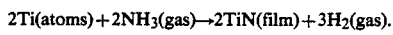

2Ti(atoms)+2NH$_3$(gas)→2TiN(film)+3H$_2$(gas).

Beale (U.S. Pat. Nos. 4,297,387; 4,412,899; 4,415,420) uses the techniques of the Bunshah Pat. No. (3,791,852) to produce films of cubic boron nitride by evaporating boron or boron alloys from an electron beam-heated source in the presence of a reactive gas such as ammonia or nitrogen. He incorporates the Bunshah patent as part of his disclosure. Other features of the Beale patents are the use of selected alloying elements such as cobalt, nickel, manganese, zirconium, iron and aluminum in the billet, and thereby also in the cubic boron nitride film, to serve as "cubic phase nucleators". A low (400-700 C.) deposition temperature is used to reduce atomic motion and prevent the natural reversion of the cubic boron nitride to hexagonal boron nitride.

Experience with the evaporation process has shown that boron is brittle and very difficult to evaporate without cracking the boron evaporation billet due to the high thermal stresses produced by the large temperature gradient from the high temperature directly under the impact spot of the electron beam and the surrounding cooler metal. The impact spot of the electron beam is approximately ⅛ inch. diameter whereas the diameter of the billet is ½ to 3 inches. Further, it is very difficult and expensive to get billets of pure boron (or boron alloys) suitable for evaporation. For both of these reasons it is desirable to have an alternate, easily evaporable, and preferably cheap, source of boron.

The present invention is predicated on the use of boric acid (H$_3$BO$_3$) as the evaporant. It is inexpensive, non-toxic, and easily evaporable from a relatively inexpensive resistance-heated evaporation source. The boric acid vapors react with ammonia gas in a plasma environment to deposit cubic boron nitride. The process consists of several consecutive steps as follows:

NH$_3$→3H+N (Dissociation)

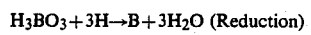

H$_3$BO$_3$+3H→B+3H$_2$O (Reduction)

B+N→BN (Activated Reaction)

These steps lead to the name Activated Dissociation Reduction-Reaction process.

There are significant differences between the prior art and the present invention:

1. The prior art uses a boron billet for evaporation. The present invention uses an easily evaporable boron compound (boric acid, $H_3BO_3$) which is reduced by the atomic hydrogen produced by the dissociation of ammonia gas in the plasma, the reduced boron then reacting with the atomic nitrogen present to form cubic boron nitride.
2. No catalysts or cubic phase nucleators are necessary.
3. The present process uses an inexpensive starting material (boric acid) compared to the expensive boron billet of the prior art.
4. The inexpensive boric acid can be readily evaporated from a cheap resistance-heated evaporation source in the present invention, compared to an expensive electron beam-heated evaporation source required to evaporate the boron in the prior art.

SUMMARY OF THE INVENTION

It is the primary object of this invention to provide a process for depositing films of cubic boron nitride and nitrides of other Group III elements in the periodic table of elements which overcomes the disadvantages of prior art processes.

It is thus an object of this invention to provide a process which utilizes 1. an inexpensive, low melting, easily evaporable starting material;
2. a low substrate temperature;
3. low evaporation and deposition temperatures; and
4. an inexpensive evaporation source.

It is a further object of this invention to provide a process which does not require catalysts or cubic phase nucleators, high pressure or high temperature reactions, cubic phase stabilizing elements, or expensive electron beams.

The present invention is a process for deposition of cubic boron nitride films at low deposition temperatures, named the Activated Dissociation Reduction-Reaction process. The process is carried out in a vacuum chamber and consists of the evaporation of boric acid ($H_3BO_3$) from a resistance-heated source such as a molybdenum boat; the introduction of ammonia gas at a low partial pressure; the creation of a plasma in the zone between the source and the substrate to ionize and activate the reaction which results in the deposition of cubic boron nitride films on a substrate (such as glass, metal, or ceramic) at a low substrate temperature. No cubic phase stabilizing elements are needed and the film is pure cubic boron nitride.

The overall reaction most probably consists of two consecutive steps:

1. Dissociation of ammonia gas in the plasma to atomic hydrogen and nitrogen:

$$NH_3(gas) \xrightarrow{Plasma} N(gas) + 3H(gas);$$ 

and

2(a) Reduction of boric acid by the atomic hydrogen produced in step 1. above to form boron which then (b) reacts with the atomic nitrogen present to form cubic boron nitride with water vapor (which is pumped off) as a by-product:

(2a) $H_3BO_3(vapor) + 3H(gas) \rightarrow B(vapor) + 3H_2O(gas)$, 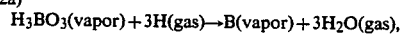

and (2b) $B(vapor) + N(gas) \rightarrow BN(film)$.

The above two equations may be written in combined form as $H_3BO_3(vapor) + 3H(gas) + N(gas) \rightarrow BN(film) + 3H_2O(vapor)$. 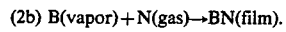 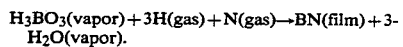

With this process, substrate temperature is not a limitation. Nor is it necessary to perform reactions at high temperature and high pressure as in the high-pressure synthesis of cubic boron nitride. The steps of compound synthesis and film growth are separated. Hence the properties of the deposit can be controlled by several experimental variables, e.g., the substrate temperature and bombardment of the growing film by positive ions from the plasma, the energy of such bombardment being controlled by the magnitude of the negative bias applied to the substrate.

The preferred embodiment of the Activated Dissociation Reduction-Reaction process for cubic boron nitride deposition includes supporting the substrate in a vacuum, preferably heating the substrate, evaporating a low-melting and easily avaporable compound such as boric acid by resistive heating to produce the corresponding vapor in the zone between the resistance heat source and the substrate, introducing ammonia gas into the zone, alone or with an inert gas such as argon, and directing a beam of low-energy electrons through the zone for colliding with the gas and vapor atoms to produce the deposit on the substrate. The beam of low-energy electrons is preferably produced with a cathode and anode arrangement with a potential of the order of 40 volts. Preferably, too, a magnetic field is provided along the electron beam path between the cathode and the anode so as to produce a helical electron movement to increase the path length and enhance the opportunity for collision between electrons and gas or vapor atoms.

The preferred embodiment of the apparatus for producing cubic boron nitride films includes a vacuum chamber, an electrical resistance heater mounted in the chamber, a substrate holder mounted in the chamber and spaced from the heater to allow for a reaction zone between heater and substrate, preferably a heater for the substrate, a means for directing the gas or gases into the zone, and a source of a beam of low-energy electrons mounted in the chamber for directing the electron beam into the zone. Preferably the apparatus also includes coils or some other suitable magnetic arrangement for generating a magnetic field in the zone to produce the desired helical electron path. Additionally, radio frequency (rf) excitation could be used with suitable internal or external coils to increase the plasma density and hence the activity of the reactions.

The process also lends itself to the deposition of nitrides of other elements in Group III of the periodic table of elements, which Group includes boron, aluminum, gallium and indium. In each case an easily evaporable compound containing a Group III element in the condensed state is used as the starting material.

BRIEF DESCRIPTION OF THE FIGURE

The single FIGURE of the drawing is a schematic vertical sectional view of a vacuum chamber and associated equipment suitable for performing the process of the invention and incorporating the presently preferred embodiment of the apparatus of the invention.

DESCRIPTION OF THE PREFERRED EMBODIMENT

The deposition apparatus includes a vacuum chamber 1 on a base ring 2 with a gasket 3 between them. The base ring rests on a base plate 4 with a sealing gasket 5. The base plate is connected to a high vacuum module 6 with a sealing gasket 7 between them. The high vacuum pumping module desirably should be capable of pumping the vacuum chamber to a pressure of less than $2 \times 10^{-6}$ torr. The chamber and the various components are held together by conventional clamps which are omitted from the figure, for reasons of clarity.

The evaporation source includes a tungsten boat 11 clamped onto a copper block 12. One clamp is isolated by a threaded ceramic 13. The evaporation assembly is mounted onto a stainless steel platform 14 via a ceramic mount 15, and the platform 14 is mounted onto the base ring 2. The power to the evaporation source is supplied by two electrical feedthroughs 16 connected to an isolated power supply 17.

The substrates 21 to be coated are mounted on substrate heater assembly 22 via clamps 23. The substrate heater assembly is supported on a ceramic mount 24 which in turn is mounted onto a stainless steel plate 25 positioned at the top end of the vacuum chamber 1, with a gasket 25'. The power for the heater assembly 22 is suppied from an isolated power supply 26 via electrical feedthroughs 27 mounted on the plate 25. The temperature of the substrate is monitored by a thermocouple 28 bonded onto a dummy substrate, with the thermocouple connected to a temperature indicator 29 via the electrical feedthroughs 30.

High purity reaction gases from cylinders 31 can be bled into the reaction zone 32 within the chamber 1. A precision leak valve 33 is used to control the pressure of the gases in the chamber. A desired ration of gases, typically ammonia and argon, can be maintained by adjusting the control valves 34 and 35.

A shutter 41, mounted on a rod 42, is manually rotated by knob 43 to move the shutter into oe out of position between the evaporation source 11 and substartes 21.

An electron emitter assembly consisting of a thoriated tungsten emitter 51, made by winding a 10 mil wire on a 1/16 inch mantle, is mounted on two isolated feedthroughs 52 which are fixed on a stainless steel plate 53. This plate is mounted to the side flank 54 of the vacuum chamber, with a sealing gasket 55. The power to the emitter 51 is supplied by a power supply 56. In front of the emitter assembly are two shields 57, held at ground potential. Anode plate 58 is screwed on to an isolated feedthrough 59 which is mounted on another stainless steel plate 60. The plate 60 is clamped to the flange 61, with a sealing gasket 62 between them. A positive potential with respect to the emitter 51 is applied to the anode assembly by a power supply 64.

Two magnetic field coils 71 are fixed onto the side flanges 54 and 61 of the vacuum chamber 1 and are energized by power supply 72.

The pumping station 6 utilized for evacuating chamber 1 may be a 6-inch diffusion pump module with a liquid nitrogen trap.

The most commonly used substrates are 0.1 inch $\times$ 1 inch $\times$ 1 inch slide glass, quartz, silicon, and freshly cleaved sodium chloride crystals. The substrate heater should be capable of maintaining the substrates at temperatures between 25 to 500 deg C. and higher.

The evaporation source is boric acid ($H_3BO_3$) in the condensed state. The power supply 56 for the emitter assembly is a variable output a.c. power supply with an output rating of 500 volt amp. The power for the anode is supplied by a 200 volt 6 amp regulated d.c. supply 64. The power to the substrate heater is provided by an isolated variable 2 KVA transformer 26. The evaporation source is energized by a 4 KVA isolated low voltage a.c. supply, typically 10-20 volts. The reaction gases are high purity ammonia gas, alone or mixed with an inert gas such as high-purity argon.

The position of the substrate heater assembly and the evaporation source can be interchanged to yield downward evaporation. This geometry of evaporation requires no clamping of substrates as these rest on the substrate heater.

Typical Operating Sequence

The vacuum chamber is initially pumped down to $2 \times 10^{-6}$ torr. With the shutter in position between the evaporation source and the substrate, the substrate heater is switched on and the substrate heated to the desired temperature, such as 350 deg C. The evaporation source is energized to 25% of the power required for evaporation for warmup and outgassing. The tungsten emitter is energized to a filament current of 8 amp. A potential of 40 volt is applied to the anode. Argon is now bled into the vacuum chamber until a plasma is established in the reaction zone. Current to the magnetic field coils is switched on. The pressure is now adjusted to $1 \times 10^{-4}$ torr. By adjusting the anode potential an anode current of 3 amp is now obtained. Ammonia gas is now bled into the vacuum chamber slowly while decreasing the argon pressure. After 15 minutes of stabilization, the power to the evaporation source is increased slowly. The shutter is now removed and films are deposited for typically 5 to 10 minutes. The reaction between the boric acid vapor and the ammonia gas is indicated by a change in color of the plasma from light pinkish blue to deep blue. After the deposition the gas supply is cut off and power to the substrate heater is switched off. The coated substrates are removed after they have cooled down to room temperature.

It has been determined that maximum efficiency of ionization is achieved with an electron energy in the range of about 20 to about 200 volts, with the preferred value of 40 volts which may be obtained by adjusting the anode power supply 46.

Typical Results

The rate of deposition of boron nitride films has been measured to be between 100 to 150 nm/min. The identification of deposited coating as boron nitride was primarily based on the observed IR spectra and electron diffraction patterns. From the IR spectra of the coating deposited on silicon deposited at 450 deg C., the strong absorption band at 6.8 $\mu$m corresponds to the bending vibration B-N and another sharp peak near 11.5 $\mu$m is due to B-N-B bending vibration. The position of the absorption band for B-N vibration was found to be independent of deposition temperature but the magnitude of the absorption changes slightly with deposition temperature and crystallinity, probably due to the change in number of B-N bending vibrations contributing to the spectra.

From the reflectance and transmittance variation with wavelength for a film of thickness 400 nm deposited at 450 deg C. on a glass substrate, the band gap of coating material was calculated from the absorption coefficient and was found to be 3.64 eV which is comparable to a value of 3.8 eV for CVD deposited hexagonal BN films on fused silica.

When deposited below 200 deg C. deposition temperature the films are amorphous. Polycrystalline films are obtained at higher deposition temperatures. The electron diffraction pattern for a film deposited at 450 deg C. on a sodium chloride substrate is of the continuous ring type, indicating a polycrystalline film. The measured d-values calculated from the pattern are comparable to cubic boron nitride d-values from ASTM data cards and also to a simple cubic phase reported by Voskoboynikov et al. The formation of cubic boron nitride is clearly established. The calculated lattice para meter is 0.367 nm, which matches the standard value of 0.362 nm. The microstructure shows fine grains of size about 25 nm. Compositional analysis of the films by AES showed the existence of carbon and oxygen impurities with a concentration of less than 10 at.% each.

Adherence of the coating was found to be good at deposition temperatures above 400 deg C. The microhardness of the coatings deposited on stainless steel was measured by a Vickers-microhardness tester at 10 gm load. Average hardness value was found to be 2128 kg/mm$^2$, which compares well with other reported values in the literature.

This invention demonstrates the development of a simple process for deposition of cubic boron nitride films. The starting materials boric acid and ammonia gas are inexpensive compared to boron. Moreover it is very safe to work with a non-toxic material like boric acid, compared to a hazardous material like boron which demands special safety precautions. The apparatus is much less expensive than the electron beam evaporation apparatus required for the evaporation of boron as an evaporant, and even less expensive compared to the high pressure—high temperature process. No cubic phase stabilizing additives are needed, nor is a catalyst necessary.

The same process can be used to deposit films of nitrides of other Group III elements on a substrate, with the appropriate choice of an easily evaporable compound of the element as an evaporant, and of the reaction gas or gas mixture. These elements include aluminum, gallium, and indium. For example, aluminum nitride films are obtained starting with aluminum organometallic compounds such as the alkyl of aluminum, and with ammonia gas. In each case the principles of the Activated Dissociation Reduction-Reactive process as described in this specification are followed.

We claim:

1. A process for depositing a film of a nitride of a Group III element in the periodic table of elements on a substrate, comprising the steps of
   supporting the substrate in a vacuum;
   evaporating an easily evaporable compound containing a Group III element in the condensed state selected from the group consisting of boric acid and organometallic compounds of aluminum, indium and gallium, by a resistance-heated evaporation source to produce a vapor of said compound or its dissociated products in a zone between the resistance-heated evaporation source and the substrate;
   introducing ammonia gas into said zone;
   extracting low-energy electrons from a heated emitter by a d.c. electric field directed across the path of said vapor in said zone, which electric field is produced by applying an electric potential between the emitter and the anode of about 20 to 200 volts;
   directing a beam of the low-energy electrons laterally through said zone for colliding with the ammonia gas and said vapor to produce ions of ammonia and said vapor and energetic neutral atoms which react with each other and with atoms of ammonia and said vapor in said zone, resulting in a deposit of a nitride of a Group III element on the substrate; and
   providing a magnetic field surrounding the beam of low-energy electrons so as to increase the collision probability with atoms of the reactants.

2. The process of claim 1 including directing the beam of electrons from a heated cathode to an anode separate from the substrate, with an electric potential connected between the cathode and the anode.

3. The process of claim 1 with the substrate located above the resistance-heated evaporation source so that said vapor moves upward from the evaporation source toward the substrate.

4. The process of claim 1 including introducing an inert gas with the ammonia gas.

5. The process of claim 1 including introducing argon gas with the ammonia gas.

6. The process of claim 2 including heating the substrate to a predetermined temperature to control the electrical, mechanical and optical properties of the deposited film.

7. The process of claim 2 including producing low-energy electrons by applying an electrical potential between the cathode and the anode of about 20 to about 200 volts.

8. The process of claim 2 including producing low-energy electrons by applying an electric potential between the cathode and the anode in the order of 40 volts.

9. The process of claim 1 in which the Group III element is boron, said compound is Boric Acid ($H_3BO_3$), and the deposit is of cubic boron nitride on the substrate.

10. The process of claim 9 including directing the beam of electrons from a heated cathode to an anode separate from the substrate, with an electric potential connected between the cathode and the anode.

11. The process of claim 9 with the substrate located above the resistance-heated evaporation source so that said vapor moves upward from the evaporation source toward the substrate.

12. The process of claim 9 including introducing an inert gas with the ammonia gas.

13. The process of claim 9 including introducing argon gas with the ammonia gas.

14. The process of claim 10 including heating the substrate to a predetermined temperature to control the electrical, mechanical and optical properties of the deposited film.

15. The process of claim 10 including producing low-energy electrons by applying an electric potential between the cathode and the anode of about 20 to about 200 volts.

16. The process of claim 10 including producing low-energy electrons by applying an electric potential between the cathode and the anode in the order of 40 volts.

* * * * *